United States Patent
Winkler

(10) Patent No.: US 10,214,261 B2
(45) Date of Patent: Feb. 26, 2019

(54) SHIELDING AGAINST ELECTROMAGNETIC RADIATION ON AN ELECTRIC MOTORCYCLE

(71) Applicant: Bayerische Motoren Werke Aktiengesellschaft, Munich (DE)

(72) Inventor: Angelika Winkler, Grasbrunn (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 88 days.

(21) Appl. No.: 15/070,771

(22) Filed: Mar. 15, 2016

(65) Prior Publication Data

US 2016/0194045 A1 Jul. 7, 2016

Related U.S. Application Data

(63) Continuation of application No. PCT/EP2014/071747, filed on Oct. 10, 2014.

(30) Foreign Application Priority Data

Nov. 11, 2013 (DE) .................. 10 2013 222 809

(51) Int. Cl.
| | |
|---|---|
| *B62J 23/00* | (2006.01) |
| *B62J 1/28* | (2006.01) |
| *B62K 11/00* | (2006.01) |
| *B62J 1/00* | (2006.01) |
| *B62M 7/00* | (2010.01) |
| *B62J 27/00* | (2006.01) |

(52) U.S. Cl.
CPC ................. *B62J 23/00* (2013.01); *B62J 1/00* (2013.01); *B62J 1/28* (2013.01); *B62J 27/00* (2013.01); *B62K 11/00* (2013.01); *B62M 7/00* (2013.01)

(58) Field of Classification Search
CPC .......................... B62J 23/00; B62J 1/00–1/28
See application file for complete search history.

(56) References Cited

U.S. PATENT DOCUMENTS

| | | |
|---|---|---|
| 2006/0192417 A1 | 8/2006 | Ellinger et al. |
| 2007/0126269 A1 | 6/2007 | Chipkar |
| 2008/0290704 A1 | 11/2008 | Chipkar |
| 2014/0329125 A1 | 11/2014 | Miyanaga et al. |

FOREIGN PATENT DOCUMENTS

| | | |
|---|---|---|
| CN | 2564447 Y | 8/2003 |
| DE | 42 01 207 A1 | 7/1993 |
| DE | 103 16 403 B4 | 11/2005 |
| DE | 10 2005 008 591 A1 | 9/2006 |
| DE | 10 2007 055 606 B4 | 3/2011 |
| EP | 0 718 180 A1 | 6/1996 |

(Continued)

OTHER PUBLICATIONS

Chinese-language Office Action Issued in counterpart Chinese Application No. 201480046796.2 dated Jul. 28, 2017 with English translation (13 pages).

(Continued)

*Primary Examiner* — David R Dunn
*Assistant Examiner* — Tania Abraham
(74) *Attorney, Agent, or Firm* — Crowell & Moring LLP

(57) ABSTRACT

A shielding element against electromagnetic radiation is provided for the seat region of an electric motorcycle. A seat includes a shielding element arranged thereon or accommodated therein.

15 Claims, 1 Drawing Sheet

(56) References Cited

FOREIGN PATENT DOCUMENTS

| EP | 1 849 691 A1 | 10/2007 |
|---|---|---|
| GB | 619266 | 3/1949 |
| WO | WO 01/15967 A1 | 3/2001 |
| WO | WO 2013/108747 A1 | 7/2013 |

OTHER PUBLICATIONS

German Office Action issued in counterpart German Application No. 10 2013 222 809.0 dated Apr. 8, 2016 (five (5) pages).
International Search Report (PCT/ISA/210) issued in PCT Application No. PCT/EP2014/071747 dated Jan. 26, 2015, with English translation (six (6) pages).
Chinese-language Office Action issued in counterpart Chinese Application No. 201480046796.2 dated Apr. 3, 2018 with English translation (10 pages).

SHIELDING AGAINST ELECTROMAGNETIC RADIATION ON AN ELECTRIC MOTORCYCLE

CROSS REFERENCE TO RELATED APPLICATIONS

This application is a continuation of PCT International Application No. PCT/EP2014/071747, filed Oct. 10, 2014, which claims priority under 35 U.S.C. § 119 from German Patent Application No. 10 2013 222 809.0, filed Nov. 11, 2013, the entire disclosures of which are herein expressly incorporated by reference.

BACKGROUND AND SUMMARY OF THE INVENTION

The invention relates to a shielding element against electromagnetic radiation, which is arranged on an electric motorcycle in the seat region and which shields electromagnetic radiation from a driver and/or passenger. The invention also relates to a seat having such a shielding element arranged thereon or received therein.

In vehicles, in particular in motorcycles and motor scooters, electric drives have also increasingly often been used in recent years in addition to conventional internal combustion engines. In two-wheeled electric vehicles, the driver sits on a seat and is substantially subjected in an unprotected manner to the electromagnetic fields which are produced, for example, by powerful current-carrying cables which extend below the seat. Although the cables are insulated in order to comply with acceptance provisions concerning electromagnetic compatibility (EMC), the effect of electromagnetic radiation with respect to humans still exists. As a result of the previously carried out official approval procedures with respect to electromagnetic compatibility, it is primarily ensured that interference influences from outside the vehicle and from the vehicle on the environment are eliminated. However, humans and human health factors are not taken into account during the technical acceptance procedures and testing.

In two-wheeled vehicles, the electromagnetic radiation resulting from the cables which extend below the seat is particularly problematic since it acts on the comparatively sensitive genital region of the driver and the passenger. As a result of the small spacing, the radiation exposure level is comparatively high.

Against this background, an object of the present invention is to provide a shield which has an advantageous receiving member and which ensures protection of the driver and passenger with respect to electromagnetic radiation in electric two-wheeled vehicles.

According to the invention, there is provided in this instance a shielding element against electromagnetic radiation, which is arranged on an electric motorcycle in the seat region and which shields electromagnetic radiation from a driver and/or passenger. An advantageous receiving member of such a shielding element is provided by the solution of a seat with a shielding element which is arranged thereon or received or integrated therein.

It is, in principle, possible to use as a shielding element any component which is suitable for retaining or shielding electromagnetic radiation. In an embodiment which is advantageous by way of example, the shielding element is a steel sheet which is from 0.5 to 3 mm thick. In a very thin embodiment, the shielding element is equivalent to a film which can be used particularly well along the shape of the seat as a lining.

An embodiment is further advantageous in which the shielding element is integrated in the seat and extends over a face of the seat which is suitable for protecting the driver with a passenger with respect to the electromagnetic radiation produced by the electric motorcycle during operation. This means that the shielding element is intended to extend substantially over the entire face of the seat, wherein an extent in the direction of the frame of the electric motorcycle, that is to say, laterally in a downward direction at least partially is also included.

In principle, in a first embodiment the shielding element is secured to a carrier of the seat, which carrier is generally formed from plastics material. In one embodiment of the shielding element as a film, this may be provided as an inner lining of the carrier. In another embodiment, it is alternatively provided for the shielding element to be co-injected into a plastics material carrier of the seat so that it remains invisible from the outer side.

In another embodiment, the shielding element is constructed itself as the carrier or a portion of the carrier of the seat, wherein in an advantageous lightweight construction, although the basic carrier of plastics material is retained, the shielding element is formed from steel and can at least partially perform an additional carrier function. For example, the shielding element may be constructed so as to be thicker in a rear region of the seat bench in order to provide additional functions such as the formation of securing devices. To this end, it is provided in an advantageous embodiment for the shielding element to have at least one receiving member for securing at least one outer component so that regions of the seat in which the shielding element is also arranged are reinforced in terms of their rigidity and force absorption capacity with respect to regions of the seat in which the shielding element is not provided. In this instance, it is possible to provide in the shielding element, for example, a thread in which screws can be introduced in order to secure handles or luggage carriers.

In order to reduce the weight of the shielding element itself, in an advantageous embodiment the shielding element has a hole arrangement which is adapted in terms of its size and/or distribution, and to keep the electromagnetic radiation of the electric motorcycle away from the driver and passenger. The hole arrangement must not exceed a specific surface-area since otherwise the shielding function would be impaired. The possible surface-area of the hole arrangement is also determined by the level of the electromagnetic radiation of the electric motorcycle.

In one embodiment, the shielding element is connected to a conductive discharge element. This may, for example, be the frame or another metal component which is suitable for absorbing charge.

The invention is not limited to the seat itself, but also relates to the entire vehicle in which a corresponding seat is fitted. According to the invention, there is also provision for including the fact that the shielding element is constructed as an extra component or is integrated in the housing of the substructure of the electric motorcycle.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
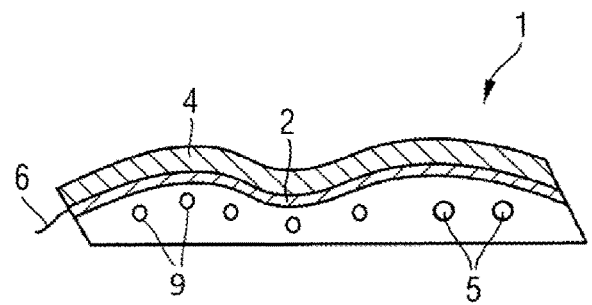
FIG. 1 is a sectioned side view of a seat in accordance with an embodiment of the invention.

In the Figures, reference numerals which are the same refer to the same components in all views.

FIG. 1 is a sectioned side view of a seat 1 according to an embodiment of the invention without upholstery. A plastics material carrier 4 forms the basic frame of the seat 1 and determines its shape. In the seat region, there is provided below the plastics material carrier 4 a shielding element 2 in the form of a steel sheet which extends as a separate layer below the plastics material carrier 4 in the direction facing the substructure of the electric motorcycle. The shielding element 2 is connected to the frame or another charge-receiving component of the electric motorcycle by way of a cable 6. In the rear region, there are illustrated schematically, by way of example, receiving members 5 to which external components can be secured. An array of lightening holes 9 in a lateral side of the shielding element 2 is schematically illustrated.

Figure 2:
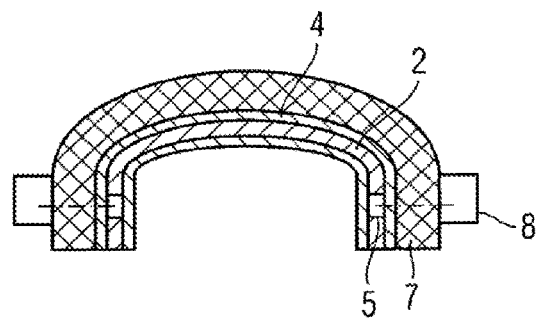
FIG. 2 is a sectioned rear view of a seat, together with its seat upholstery and an externally connected component.

FIG. 2 is a sectioned rear view of a seat bench 1, wherein, with respect to the illustration from FIG. 1, upholstery 7 is also provided schematically in FIG. 2. Furthermore, the shielding element 2 is not arranged on the plastics material carrier 4, but is instead received therein. This can be achieved by the shielding element 2 being co-injected in the plastics material carrier 4. The shielding element 2 extends in the peripheral direction over the entire curve length of the seat so that a complete shielding of the electromagnetic radiation with respect to the genital region and the upper thighs of a driver and passenger is achieved. For example, in FIG. 2, handles 8 are provided on the seat bench 1. The handles 8 can be screwed into corresponding receiving members 5. For this reason, the shielding element 2 is constructed to be thicker in the rear region in order to be able to act as a force absorption element. Consequently, it performs two functions, that is to say, the shielding with respect to electromagnetic radiation and the stiffening of the seat in predetermined regions.

The invention is not limited in terms of the construction thereof to the preferred embodiments which have been set out above since, in principle, the shielding element can also be secured as an extra component to the motorcycle, without integrating it in the seat. There are further contemplated a number of variants which also make use of the solution set out, with embodiments which are in principle of different types. For example, the shielding element may be retrofitted to existing frame portions or seat benches using rapid-fit or clip-fit closures or extend over only a portion of the seat bench.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A component, comprising:
a shielding element that shields against electromagnetic radiation,
wherein
the shielding element is arranged in a seat region of an electric motorcycle,
the shielding element is configured to shield electromagnetic radiation from a driver and/or passenger of the electric motorcycle,
the shielding element has a hole arrangement therein configured in at least one of hole size and hole distribution so that the shielding element keeps the electromagnetic radiation of the electric motorcycle away from the driver, and
the shielding element has at least one receiving member configured to secure at least one outer component to the shielding element, the at least one outer component including one or more of a handle and a luggage carrier.

2. The component according to claim 1, wherein the shielding element comprises a steel sheet having a thickness of between 0.5 to 3 mm.

3. The component according to claim 1, wherein the shielding element is connected to a conductive discharge element.

4. The component according to claim 3, wherein the conductive discharge element is connected to a chassis of the electric motorcycle.

5. A seat of an electric motorcycle, the seat comprising:
a shielding element that shields against electromagnetic radiation,
wherein
the shielding element is arranged on the seat or received in the seat so as to shield electromagnetic radiation of the electric motorcycle from a driver and/or a passenger of the electric motorcycle,
the shielding element has a hole arrangement therein configured in at least one of hole size and hole distribution so that the shielding element keeps the electromagnetic radiation of the electric motorcycle away from the driver, and
the shielding element has at least one receiving member configured to secure at least one outer component to the shielding element, the at least one outer component including one or more of a handle and a luggage carrier.

6. The seat according to claim 5, wherein the shielding element is integrated in the seat and extends over a face of the seat, the extent of the shielding element being configured to protect both the driver and the passenger from electromagnetic radiation produced by the electric motorcycle during operation.

7. The seat according to claim 5, further comprising a plastics material carrier of the seat, wherein the shielding element is co-injected in the plastics material carrier.

8. The seat according to claim 5, wherein the shielding element at least partially forms a carrier of the seat.

9. The seat according to claim 5, wherein:
regions of the seat in which the shielding element is arranged are reinforced in terms of rigidity and force absorption capacity with respect to regions of the seat in which the shielding element is not provided.

10. An electric motorcycle, comprising:
a seat; and
a shielding element arranged in a region of the seat, wherein the shielding element is configured to shield a driver and/or a passenger of the electric motorcycle from electromagnetic radiation produced by the electric motorcycle,
wherein
the shielding element has a hole arrangement therein configured in at least one of hole size and hole distribution so that the shielding element keeps the electromagnetic radiation of the electric motorcycle away from the driver, and the shielding element has at least one receiving member configured to secure at least one outer component to the shielding element, the at least one outer component including one or more of a handle and a luggage carrier.

11. The electric motorcycle according to claim 10, wherein the shielding element is a steel sheet having a thickness of 0.5 to 3 mm.

12. The electric motorcycle according to claim 10, wherein the shielding element is arranged on the seat or integrated in the seat.

13. The electric motorcycle according to claim 10, wherein the seat comprises a plastics material carrier in which the shielding element is integrated.

14. The electric motorcycle according to claim 10, wherein the shielding element is connected to a chassis of the electric motorcycle via a conductive discharge element.

15. The electric motorcycle according to claim 10, wherein the shielding element is integrated in the seat and extends over a sufficient portion of the seat so as to protect both the driver and the passenger from electromagnetic radiation produced by the electric motorcycle.

* * * * *